United States Patent [19]

Jones et al.

[11] Patent Number: 4,717,644
[45] Date of Patent: Jan. 5, 1988

[54] HYBRID ELECTRON BEAM AND OPTICAL LITHOGRAPHY METHOD

[75] Inventors: Fletcher Jones; Henry R. Voelker, both of Ossining, N.Y.

[73] Assignee: International Business Machines Corporation, Armonk, N.Y.

[21] Appl. No.: 451,682

[22] Filed: Dec. 20, 1982

[51] Int. Cl.$^4$ .............................................. G03C 5/00
[52] U.S. Cl. .................................... 430/296; 430/311; 430/326; 430/942; 250/492.3
[58] Field of Search ............... 430/296, 942, 311, 326; 250/492.3

[56] References Cited

U.S. PATENT DOCUMENTS 4,165,395  8/1979  Chang ................................... 427/43
4,264,711  4/1981  Greeneich ........................... 430/296

FOREIGN PATENT DOCUMENTS 55-41785  3/1980  Japan .................................. 430/296
57-03318  6/1982  Japan .................................. 430/296

OTHER PUBLICATIONS

Berker et al., IEEE Electron Device Letters, vol. EDL-2, No. 11, pp. 281-283, (Nov. 1981).

Primary Examiner—John E. Kittle
Assistant Examiner—José G. Dees
Attorney, Agent, or Firm—John J. Goodwin

[57] ABSTRACT

A complete lithographic exposure pattern is formed in accordance with this invention by forming part of the complete pattern with electron beam radiation and forming the remaining part with light radiation. The electron beam exposure pattern part delineates all of the edges of the desired complete pattern while the optical exposure pattern part fills in any remaining regions, together forming the desired complete exposure pattern. Since all edges are delineated by electron beam radiation, any radiation sensitive layer exposed to the complete pattern will develop edges characteristic of an electron beam pattern exposure.

Electron beam exposure system thruput is improved because the whole pattern is not exposed by electron beam. Preferably, the exposure width of the electron beam edge delineation is on the order of the minimum linewidth of the pattern, so that proximity effects will be automatically reduced or eliminated without requiring computation of the exposure contribution from adjacent shapes in the pattern due to lateral scattering effects and without requiring any variation in the applied electron beam exposure dose. Use of a wider exposure width for electron beam delineation of pattern edges has the advantage that alignment tolerance of the optical exposure pattern part with respect to the electron beam exposure pattern part is increased.

10 Claims, 11 Drawing Figures

FIG. 5.1 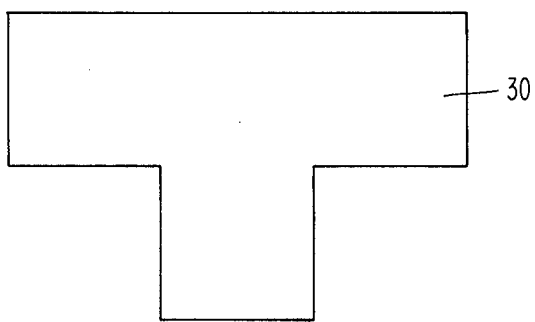
FIG. 5.2 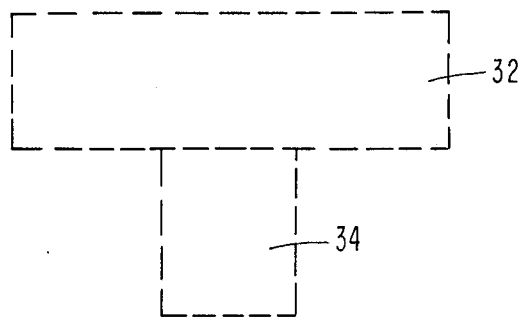
FIG. 5.3 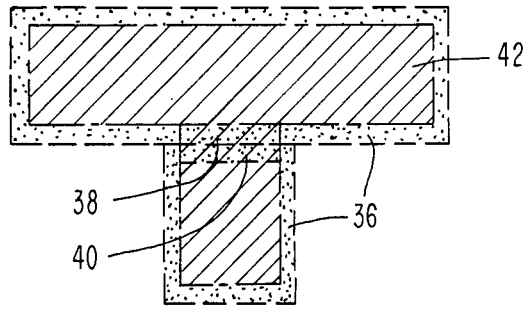
FIG. 5.4 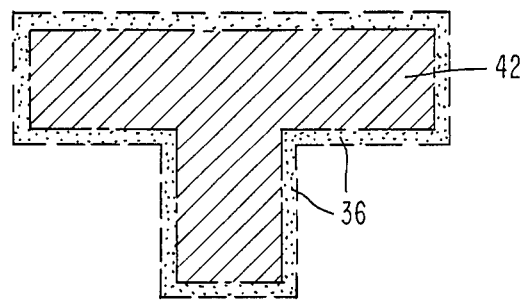

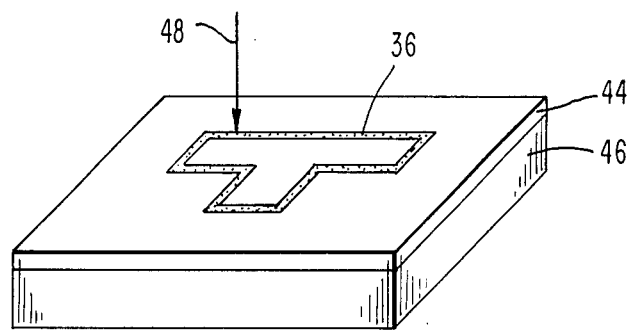
FIG. 6.1
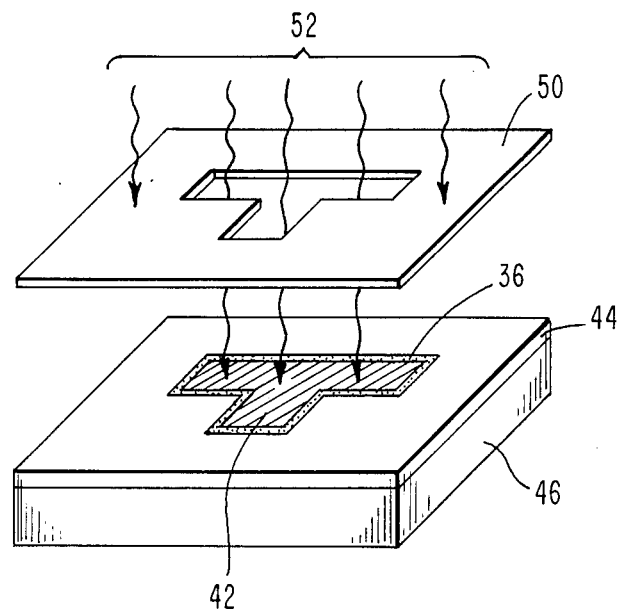
FIG. 6.2
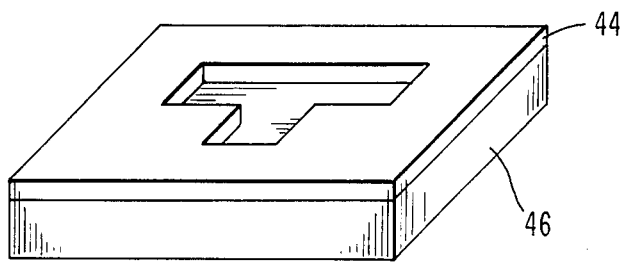
FIG. 6.3

HYBRID ELECTRON BEAM AND OPTICAL LITHOGRAPHY METHOD

TECHNICAL FIELD

This invention relates to electron beam lithography and more particularly to methods for improving electron beam exposure system thruput and methods for reducing or eliminating electron beam proximity effects.

BACKGROUND ART

Electron beams can be formed with a very small diameter and have been used to write very high resolution patterns for microcircuit fabrication. Small diameter electron beams have been used not only as a direct writing lithography tool during fabrication of high density microcircuits but also indirectly to form high resolution masks for use in fabricating microcircuits.

Unfortunately, serial exposure of a high resolution electron beam pattern is very time consuming. The high cost of electron beam exposure systems and the relatively low thruput when high density lithographic exposure patterns of practical size are being formed (at best only a dozen pattern exposures per hour) has limited the direct manufacturing use of electron beam lithography, particularly as a direct writing microcircuit fabrication tool. There is a need for much higher thruput (i.e. more pattern exposures per hour per electron beam exposure system).

In an article by T. Barker and S. Bernacki entitled "Dual-Polarity, Single-Resist Mixed (E-Beam/Photo Lithography," IEEE Electron Device Letters, Vol. EDL-2, No. 11, pp. 281-283 (November 1981), a method is described in which small geometries or shapes in a pattern are exposed with an electron beam system and large geometries or shapes in the same pattern are exposed with light. It has been assumed that it will take less time to expose only the small shapes to an electron beam than it would take to expose all of the shapes in the pattern to an electron beam. Certainly this is true with some electron beam exposure systems. Unfortunately, upon development, the optically exposed shapes in the pattern will have a resolution and edge profile determined by the optical exposure system and the optical exposure/development process, while the electron beam exposed shapes in the pattern will have a resolution and edge profile determined by the electron beam system and the electron beam exposure/development process. This difference imposes additional process and pattern design constraints which are not present when the entire pattern is electron beam exposed. While a new or modified fabrication process or pattern design might be developed to take advantage of this method, it cannot be used as a practical matter as an exposure process which may be directly substituted in place of electron beam pattern exposure.

Another problem which has impeded more extensive use of high resolution electron beam lithography is "proximity effect." When an electron beam penetrates a material, such as an electron beam sensitive resist, the high energy primary electrons in the beam collide with molecules in the material and become laterally deflected or scattered in a random process. Secondary electrons are also released by the collisions and travel not only in the forward direction but also laterally and in the backward direction. Back scattering of secondary electrons is particularly great at material interfaces such as the boundary between an electron beam sensitive resist and a supporting substrate. The lateral spreading of the primary and secondary electrons causes nearby lateral regions to be exposed to scattered electrons. When two regions to be exposed are positioned close together, each receives not only the direct electron beam exposure during irradiation of that region, but also an extra dose of electron beam exposure due to the lateral scattering or spreading of electrons during exposure of the adjacent region. As a result, closely adjacent regions become more heavily exposed from the same incident dose than do isolated regions. Accordingly, when an electron beam sensitive resist is exposed to an entire pattern at a constant incident electron beam dose, electron beam exposed regions which are adjacent to other electron beam exposed regions develop differently than do isolated electron beam exposed regions. This has become known as the proximity effect.

A prior art method for avoiding proximity effects is to compensate for the expected added exposure contributed by electrons scattered from adjacent regions by correspondingly reducing the incident exposure dose of the region. Elaborate computer programs have been developed which calculate the dose needed at each elemental region of a complex pattern so as to get a substantially uniform total exposure everywhere in the pattern. Isolated regions get a greater incident exposure than regions adjacent to other regions.

While this technique is highly effective, it is also rather expensive due to the high cost of developing such programs and the extra expense in making the extensive computer calculations required, storing the dose data, and developing, fabricating and maintaining electron beam equipment having a computer controlled variable dose capability.

Another problem with the prior art technique of varying the exposure dose in order to compensate for proximity effect is that this technique cannot be used at all when the exposure process inherently produces a uniform incident exposure dose everywhere in the exposure pattern. This occurs, for example, if a mask is illuminated with an electron flood beam to form an electron beam exposure pattern or if a patterned layer directly emits a pattern of electrons. Such electron beam shadow masks and patterned electron emitters are not in practical use at this time but future development of such techniques is possible.

In a companion U.S. patent application, Ser. No. 431,241, filed Nov. 3, 1982 by Fletcher Jones for an "Electron Beam Lithography Proximity Correction Method," a technique is described for modifying an electron beam exposure pattern so as to make the exposure pattern less sensitive to proximity effects, without computing the exposure contribution from adjacent shapes due to lateral scattering and without requiring that the applied electron beam exposure dose be varied. Unfortunately, this technique does not significantly change the thruput of the electron beam exposure system.

It is an object of this invention to reduce the amount of electron beam exposure system time required in making a high resolution pattern exposure.

Another object is to improve electron beam exposure system thruput while maintaining electron beam resolution everywhere in the pattern and while maintaining a developed edge profile everwhere characteristic of an electron beam pattern exposure.

It is also an object of this invention to simultaneously reduce or eliminate electron beam proximity effects without requiring that the applied exposure dose be varied.

Still another object is to provide a pattern exposure method having improved electron beam exposure system thruput and reduced electron beam proximity effects without requiring computation of the exposure contribution from adjacent shapes due to lateral scattering effects.

DISCLOSURE OF THE INVENTION

A complete lithographic exposure pattern is formed in accordance with this invention by forming part of the complete pattern with electron beam radiation and forming the remaining part with light radiation. The electron beam exposure pattern part delineates all of the edges of the desired complete pattern while the optical exposure pattern part fills in any remaining regions, together forming the desired complete exposure pattern. Since all edges are delineated by electron beam radiation, any radiation sensitive layer exposed to the complete pattern will develop edges characteristic of an electron beam pattern exposure.

Electron beam exposure system thruput is improved because the whole pattern in not exposed by electron beam. Preferably, the exposure width of the electron beam edge delineation is on the order of the minimum linewidth of the pattern, so that proximity effects will be automatically reduced or eliminated without requiring computation of the exposure contribution from adjacent shapes in the pattern due to lateral scattering effects and without requiring any variation in the applied electron beam exposure dose. Use of a wider exposure width for electron beam delineation of pattern edges has the advantage that alignment tolerance of the optical exposure pattern part with respect to the electron beam exposure pattern part is increased.

BRIEF DESCRIPTION OF THE DRAWINGS

FIGS. 5.1-5.4 step-by-step illustrate the formation of constituent electron beam and optical exposure pattern parts for another simple overall exposure pattern.

FIGS. 6.1-6.3 illustrate formation of a resist pattern using the exposure process of this invention.

BEST MODE OF CARRYING OUT THE INVENTION

Figure 1:
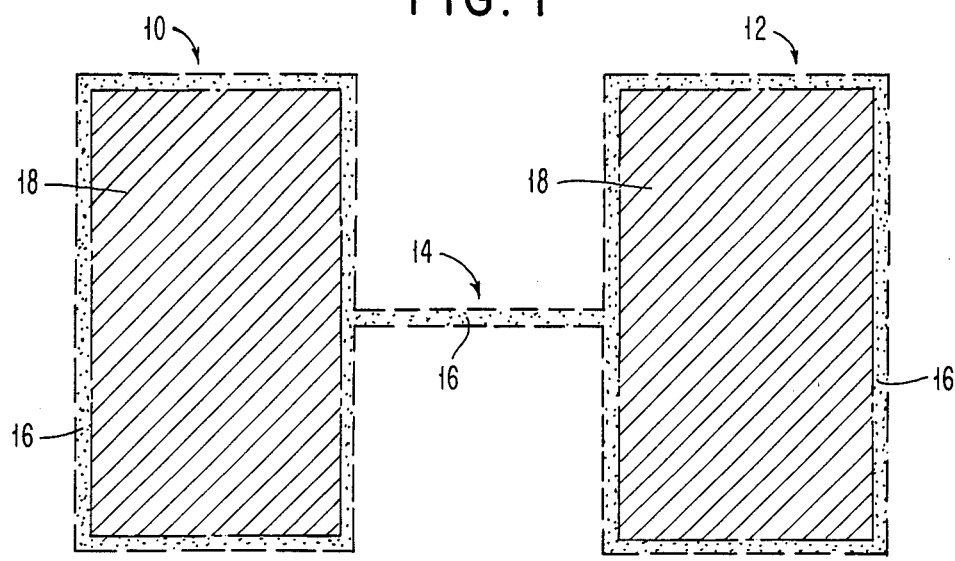
FIG. 1 illustrates a simple overall exposure pattern formed in accordance with this invention by superposing an electron beam exposure pattern and optical exposure pattern.

FIG. 1 illustrates a simple overall exposure pattern consisting of two large rectangular areas 10, 12 and a connecting narrow bar 14. In accordance with this invention, the edges of the overall exposure pattern are delineated with electron beam radiation while the non-edge regions are exposed with light. The edge pattern part 16 is stippled while the non-edge pattern part 18 is hatched.

Preferably the edge delineation with electron beam should be as narrow as practical in order to reduce undesirable proximity effects. Undesirable proximity effects arise primarily from the excessive number of scattered electrons which are generated when an electron beam exposes a relatively large area. By avoiding any large area electron beam exposures, the present invention automatically avoids proximity effects in large part.

In FIG. 1, it has been assumed that the narrow bar 14 has a width equal to the minimum linewidth of the overall exposure pattern. Accordingly, the narrow bar 14 has been entirely exposed using electron beam radiation. Preferably, the other edges are delineated with a band of electron beam radiation also about equal to the minimum linewidth of the overall exposure pattern, as shown in FIG. 1. It is possible, however, for the width of the electron beam edge delineation to be either wider or narrower than the exposure pattern minimum linewidth.

Figure 2:
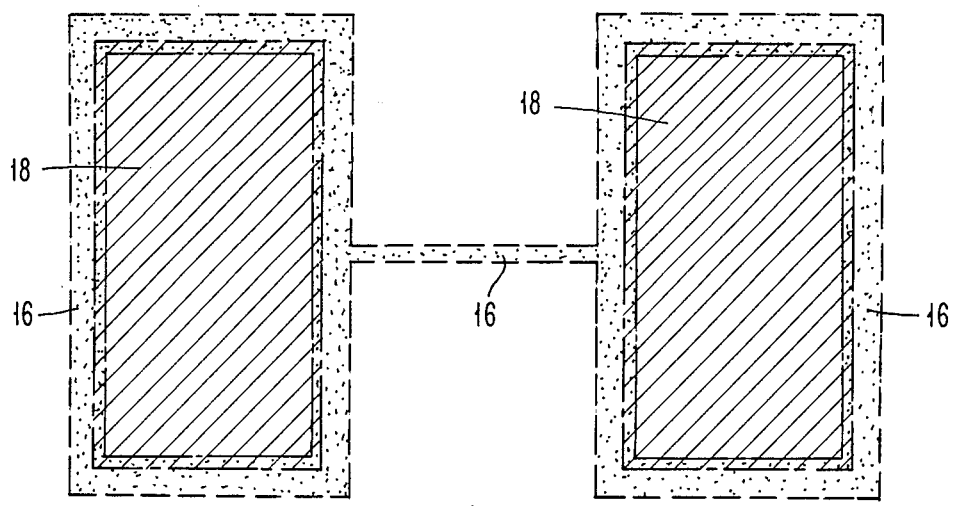
FIG. 2 shows the same overall exposure pattern formed by superposing modified electron beam and optical exposure patterns which improve pattern misalignment tolerance.

If the electron beam exposure system can form an electron beam exposed band of a width less than the exposure pattern minimum linewidth and sufficiently accurate alignment of the optical and electron beam patterns can be done, an edge delineation of less width than the minimum linewidth might further reduce undesirable proximity effects. A wider electron beam edge delineation is shown in FIG. 2. As will become more apparent, a wider edge delineation with electron beam is useful, for example, for reducing the alignment accuracy required when superposing or overlaying the electron beam exposure pattern and the optical exposure pattern in accordance with this invention. Unfortunately optical exposure patterns are difficult to form at a resolution of better than about one-half micron or so. X-ray lithography might in the future extend this limit to some extent. The present resolution limits for optical lithography, however, suggests a practical minimum width for the electron beam edge bands of about one-half micron.

Figure 3:
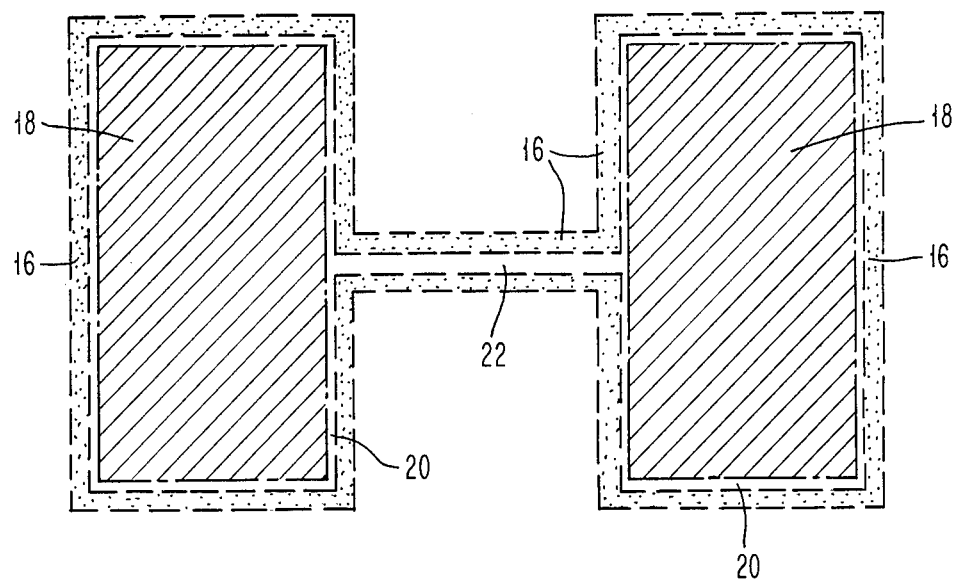
FIG. 3 illustrates an overall exposure pattern where electron scattering is relied upon to provide some of the pattern exposure.

In FIG. 2 the optical exposure part 18 overlaps the electron beam exposure part 16. Just the reverse is shown in FIG. 3 where there is a nominally unexposed band 20 between the optically exposed part 18 and the electron beam exposed part 16. A nominally unexposed band can be tolerated because electrons will be scattered into the nominally unexposed band from the adjacent electron beam exposed band. Also, as a practical matter, any line having a nominal exposure width will always develop into a somewhat wider line. This edge creep during development of an exposed pattern can be relied upon to remove a nominally unexposed band of suitably narrow width. A nominally unexposed band 22 of suitably narrow width also may be present between two electron beam exposed edge delineations, as illustrated in FIG. 3. This nominally unexposed band 22 also will disappear during development, if it is sufficiently narrow.

Figure 4:
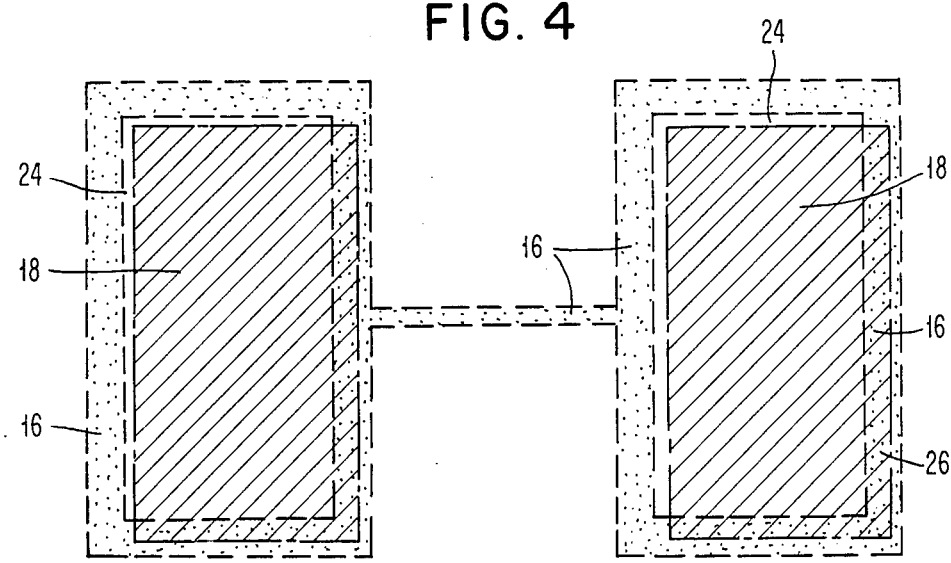
FIG. 4 shows the electron beam and optical exposure patterns of FIG. 2 in misalignment but producing the same overall exposure pattern.

FIG. 4 illustrates a slight misregistration or misalignment of the optically exposed pattern part of FIG. 2 with respect to the electron beam exposed pattern part. In FIG. 2, the optical exposure pattern and the electron beam exposure pattern overlap. In FIG. 4, due to the misalignment there are regions 24 where the optical exposure pattern and the electron beam exposure pattern do not overlap at all and other regions 26 where they overlap much more than FIG. 2. Fortunately, media which are sensitive both to electron beam and light radiation generally develop similarly (except perhaps at edges) even when exposed to both.

As previously described, suitably narrow unexposed bands will disappear during development while increased overlap of electron beam and optical exposure parts has no significant effect so long as the outside edge is still defined by the electron beam radiation. Consequently, a radiation sensitive layer exposed to the misregistered superposed pattern illustrated in FIG. 4 will develop into substantially the same final pattern as would a radiation sensitive layer exposed to the correctly registered superposed pattern shown in FIG. 2. This tolerance to some misalignment between the optical exposure pattern and the electron beam exposure pattern generally improves with the width of the electron beam edge delineation and the overlap between optical and electron beam patterns.

Use of the process to form a lithographic resist pattern will now be described in detail. It will be assumed that the pattern to be formed in a resist layer is the T pattern 30 shown in FIG. 5.1. The edges of the desired T pattern are first biased or moved inward to compensate for the edge creep (or movement of edges) which occurs when a nominally exposed pattern is developed. The amount of this bias depends upon the composition and thickness of the radiation sensitive material to be exposed, as well as the type and dose of the pattern exposure at the edges thereof, the type and length of development, etc. In general the amount of bias needed is determined by exposing and developing a test pattern and then measuring the resulting amount of edge creep.

An edge biased T pattern is shown in FIG. 5.2. This biased pattern is also subdivided into two elemental shapes (a rectangle 32 and a square 34) as is ordinarily done for a pattern to be electron beam written. Partitioning of electron beam patterns is done generally in order to facilitate data compaction and to simplify implementation of a pattern generator for controlling electron beam writing. Partitionment is not actually required by the method of this invention.

In FIG. 5.3, the edges of each of the elemental shapes are delineated by electron beam exposure bands to form an electron beam exposure pattern 36. It should be noted that as a result of fully edge delineating shapes which are not separate from each other, edge band parts 38, 40 lie within the T figure and do not actually delineate any outside edges of the complete pattern. This results in unnecessary electron beam exposure of some regions which could have been optically exposed, but it has no detrimental effect upon the resulting exposure pattern. If the electron beam writing system can just as well and just as efficiently expose only the outside edges of a complete unpartitioned pattern, then such an electron beam pattern is preferable assuming no other disadvantages are generated as a result. FIG. 5.4 illustrates an alternative electron beam exposure pattern 36 corresponding to an unpartitioned exposure pattern.

Superposed upon the electron beam exposure pattern 36 of FIG. 5.3 is an optical exposure pattern 42. The illustrated optical exposure pattern also covers or overlaps edge band parts 38, 40, which do not correspond with outside edges of the complete pattern. It is alternatively possible in FIG. 5.3 to exclude edge band parts 38, 40 from the optical exposure pattern, if desired. Optical exposure pattern 42 is also shown in FIG. 5.4.

The composite exposure pattern in FIG. 5.4 will now be used to form a resist pattern. In FIG. 6.1, the electron beam exposure pattern 36 is applied to a radiation sensitive resist layer 44 on an object 46 using a steered electron beam 48. Suitable resists for this purpose are, for example, Shipley AZ1350J resist, Shipley AZ2400 resist, or a polymethylmethacrylate (PMMA) resist.

In FIG. 6.2 the optical exposure pattern 42 is applied to the radiation sensitive resist layer 44 by imaging a mask 50 with an optical flood beam 52. The mask 50 may be prepared using standard lithographic techniques such as electron beam lithography. A flood source 52 is used which emits light (preferably ultraviolet) in a range where the resist is sensitive. Alignment of the mask 50 with respect to the exposure pattern 36 is done using standard alignment techniques. Preferably both the electron beam exposure pattern 36 and the mask 50 are each registered with respect to alignment marks (not shown) carried by the object 46. Imaging of the mask onto the resist layer 44 may be done using contact or proximity or projection printing lithography techniques.

In FIG. 6.3 the exposed resist layer 44 has been developed. If the resist is positive acting, the exposed regions will dissolve away, as shown, leaving a T shaped opening through the resist layer. If the resist is negative acting, the unexposed regions of the resist layer will dissolve away instead.

It should be apparent to one of ordinary skill that certain changes and modifications can be made to the present invention. For example, while formation of a complete exposure pattern has been described by first exposing with an electron beam exposure pattern and then by exposing with an optical exposure pattern, the order of the exposures could be reversed and the two exposures could in theory be done simultaneously. Also, while the electron beam exposure pattern was illustrated as being generated by direct writing with a steered electron beam, it is possible in theory to use an electron beam mask or patterned electron emitter instead. The optical exposure pattern also could be generated in theory using a steered optical beam. These and further modifications may be made without departing from the spirit and scope of the present invention, which is defined by the following claims.

Having thus described our invention, what we claim as new, and desire to secure by Letters Patent is:

1. A method of exposing a radiation sensitive layer to a pattern having electron beam defined edges and resolution, but with improved electron beam exposure system thruput and reduced sensitivity to electron beam proximity effects, comprising the steps of:

electron beam exposing a radiation sensitive layer to an edge pattern, said edge pattern corresponding with the edge regions of a desired exposure pattern, optically exposing said radiation sensitive layer to a non-edge pattern, said non-edge pattern corresponding with non-edge regions of said desired exposure pattern, said electron beam exposure of an edge pattern and said optical exposure of a non-edge pattern being superposed to form said desired exposure pattern together.

2. A method as defined in claim 1 wherein said edge pattern comprises bands corresponding with all edges of the desired exposure pattern.

3. A method as defined in claim 2 wherein said edge bands have a width on the order of the minimum linewidth of said exposure pattern.

4. A method as defined in claim 3 wherein said edge bands have a width on the order of one-half micron.

5. A method as defined in claim 2 wherein said non-edge pattern comprises all regions of said desired exposure pattern which do not correspond with said edge pattern.

6. A method of forming a lithographic resist pattern, comprising the steps of:
delineating the edges of a desired resist pattern by exposing a radiation sensitive resist layer to a pattern of electron beam radiation corresponding with the edges of said desired resist pattern;
filling in the non-edge regions of said desired resist pattern by exposing said radiation sensitive resist layer to a pattern of light radiation corresponding with the non-edge regions of said desired resist pattern; and
developing said exposed resist layer to form said desired resist pattern.

7. The method defined in claim 6 wherein said pattern of electron beam radiation comprises edge bands defining all of the edges of the desired resist pattern.

8. The method defined in claim 7 wherein said resist layer is positive acting so that said desired resist pattern corresponds with exposed regions of said resist layer.

9. A patterned layer formed by a lithographic process, said lithographic process comprising the steps of:
delineating the edges of a desired pattern by electron beam exposure of an edge pattern part of the desired pattern; and
defining non-edge regions of said desired pattern by optical exposure of a non-edge pattern part of said desired pattern,
said electron beam exposure and said optical exposure being superposed to define said desired pattern together.

10. A patterned layer as defined in claim 9 wherein said edge pattern part is a pattern of edge bands corresponding with the edges of said desired pattern.

* * * * *